United States Patent [19]

Owechko

[11] Patent Number: 5,361,238
[45] Date of Patent: Nov. 1, 1994

[54] OPTICAL CACHE MEMORY FOR MAGNETIC AND OPTICAL DISK STORAGE

[75] Inventor: Yuri Owechko, Newbury Park, Calif.

[73] Assignee: Hughes Aircraft Company, Los Angeles, Calif.

[21] Appl. No.: 60,602

[22] Filed: May 12, 1993

[51] Int. Cl.$^5$ .......................................... G11C 13/04
[52] U.S. Cl. .................. 365/234; 365/125; 365/216; 365/235
[58] Field of Search ............... 365/234, 235, 215, 216, 365/117, 124, 125, 127; 250/201.9

[56] References Cited

U.S. PATENT DOCUMENTS

| | | | |
|---|---|---|---|
| 3,891,976 | 6/1975 | Carlsen | 365/235 |
| 4,034,355 | 7/1977 | Carlsen | 365/235 |
| 4,052,706 | 10/1977 | Spitz | 365/235 |
| 4,860,253 | 8/1989 | Owechko | 365/125 |
| 4,959,532 | 9/1990 | Owechko | 250/201.9 |
| 4,988,153 | 1/1991 | Paek | 365/235 X |
| 5,007,690 | 4/1991 | Chern | 365/235 X |

OTHER PUBLICATIONS

"Potentials of two-photon based 3-D optical memories for high performance computing", S. Hunter et al., AppliedOptics, vol. 29, No. 14, May 10, 1990, pp. 2058-2066.

"Crystal Clear Storage", T. Parish, State of the Art Magnetic vs. Optical, Nov. 1990, BYTE, pp. 283-288.

Primary Examiner—Eugene R. LaRoche
Assistant Examiner—Son Mai
Attorney, Agent, or Firm—V. D. Duraiswamy; W. K. Denson-Low

[57] ABSTRACT

An optical cache memory architecture is utilized that has the advantages of fast access time, high bandwidth and high density. The optical cache memory architecture stores data holographically with greatly reduced crosstalk and distortions. The memory architecture uses the beam fanning effect present within a high gain photorefractive crystal to eliminate the so-called Bragg degeneracy.

13 Claims, 5 Drawing Sheets

$\vec{KR} + \vec{KG} = \vec{KO}$

OPTICAL CACHE MEMORY FOR MAGNETIC AND OPTICAL DISK STORAGE

FIELD OF THE INVENTION

The present invention relates to memory architectures, and more particularly to a holographic memory architecture.

BACKGROUND OF THE INVENTION

Memories in computers are arranged in a hierarchical manner because of trade-offs that must be made between speed, storage density, and cost. The fastest, highest cost memory, static random access memory (SRAM), is located as close as possible to the CPU, usually on the same chip. SRAM is limited in storage capacity because of its high cost. Main memory normally consists of dynamic random access memory (DRAM), which, due to its simpler cell layout can be made much denser. It is slower than SRAM because its contents need to be constantly refreshed and also because it is located further from the CPU on separate chips.

A well-known empirical observation is that, on the average, a small portion of the memory is used a large portion of the time. In other words, some of the data are used many times by the CPU while the rest is used only infrequently. Another empirical principle in memory design is locality. It is more likely that a particular datum will be needed soon if it or nearby data was fetched recently. This is why cache memory is useful for speeding up computer systems. A small section of fast but expensive SRAM is used to store data that were more recently read from or written to slower but larger DRAM. The next time this datum is needed, it can be fetched from fast SRAM rather than slow DRAM. On the average this technique can increase system speed dramatically.

This same cache memory principle is also found in the next stage in the memory hierarchy: between DRAM and mass storage devices consisting of magnetic and optical disks. Optical disks are very useful for storage of very large databases (tens of gigabits or more using replaceable disks) and have many important government and commercial applications. Their performance is limited by slow access times (20 to 200 ms) and moderate I/O bandwidths (20 Mbits/s per disk). DRAM caches are currently used to partially offset these limitations in a similar fashion as SRAM caches do for DRAM main memory. However, although DRAM densities are constantly increasing, access times and I/O bandwidths have increased much more slowly due to the nature of DRAM architecture and the trade-offs that must be made when density is increased.

Hence, what is needed is a high capacity memory that would have faster access times and larger bandwidths than realized in traditional memory technologies. This new memory architecture must be adaptable to present technology and meet the requirements of commercial and government applications. The present invention addresses these needs.

SUMMARY OF THE INVENTION

An optical cache memory architecture of the present invention is provided that allows for increased memory bandwidth and faster access times than previously known memory architectures. The optical cache memory architecture for use with a computer comprises a cache controller for receiving and controlling address information from the computer, means for receiving data information from the computer and means for the receiving address information from the cache controller. The architecture also includes a holographic means coupled to the data information receiving means and the address information receiving means for recording the address information and data information, the holographic means including beam fanning to allow for multiple 1-D and 2-D phase codes. The architecture also including means for converting the recorded holographic data and address information into digital data information.

In the optical cache memory architecture of the present invention, data is stored holographically in a photorefractive crystal such as barium titanate. A system to holographically record 2-D data pages without the crosstalk and distortions which normally occur in conventional holography when arbitrary 2-D patterns are used to address the data is provided.

The system is implemented by using the nonlinear optical effect in high gain photorefractive crystals known as "beam fanning" to implement both angular and spatial multiplexing (superposition) of holograms simultaneously. This greatly improves the quality of holographic recordings for arbitrary 2-D reference patterns by eliminating crosstalk arising from so-called Bragg degeneracy.

DETAILED DESCRIPTION OF THE INVENTION

The present invention relates to an improvement in an optical cache memory architecture. The following description is presented to enable one of ordinary skill in the art to make and use the invention and is provided in the context of a patent application and its requirements. Various modifications to the preferred embodiment will be readily apparent to those skilled in the art and are within the generic principles and features described herein.

Figure 1:
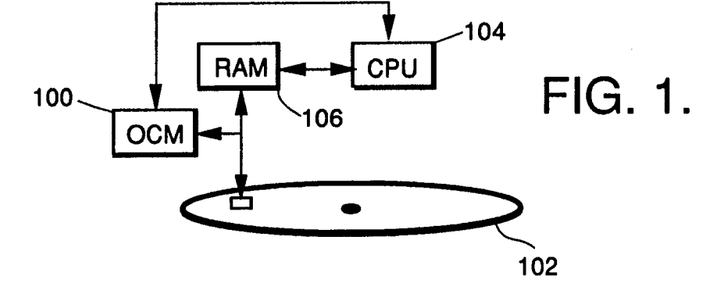
FIG. 1 is a block diagram of a computer system including an optical cache memory.

A diagram of an optical cache memory 100 in a computer system 10 in accordance with the present invention is shown in FIG. 1. Data read from or written to the disk 102 by CPU 104 are also written to the RAM 106 and optical cache memory architecture 100. The next time the data is needed, it can be quickly retrieved from the optical cache memory architecture 100 rather than the disk. The optical cache memory architecture 100 comprises a cache controller 1002 which controls a charge injection device (CID) detector 1001 and a two dimensional (2-D) spatial light modulator SLM 1004. A second 2-D SLM 1006 receives the data from the disk 102 or the CPU 104. The data and address information from 2-D SLMs 1004 and 1006 respectively are provided to a photorefractive crystal 1008. The crystal 1008 provides a hologram to CID detector 1001 for presentation to CPU 104.

Data is stored holographically in a photorefractive crystal such as, for example, barium titanate. Through the system of the present invention, multiple 2-D pages of bits are holographically recorded using 2-D reference (address) patterns without the crosstalk and distortions that normally occur in conventional holography for arbitrary 2-D reference patterns.

U.S. Pat. No. 4,959,532 assigned to the assignee of the present application, and entitled *An Optical Neural Network* discloses the use of multiple gratings within a phase conjugate mirror (PCM). The gratings are then adjusted to provide the desired output for the neural network. The present invention utilizes the concept of multiple gratings in a different way to provide an improved memory architecture.

Figure 2:
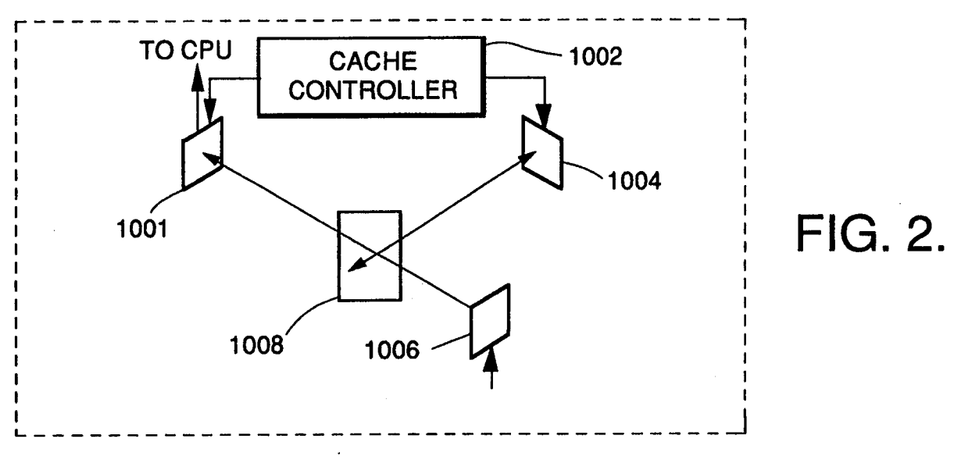
FIG. 2 is a block diagram of an optical cache memory in accordance with the present invention.

As shown in FIG. 2, two spatial light modulators (SLMs) 1004 and 1006 are used in the optical cache memory: an address SLM 1004 which retrieves stored memory pages using 2-D orthogonal phase codes and a 2-D data SLM 1006 which formats serial bit streams into pages for recording in the photorefractive crystal.

The address SLM 1004 generates the reference beams for recording the holograms. The I/O bandwidth of the data SLM 1006 is designed to match the disk of a computer or the like being cached. For a 20 Mbits input from the disk and a 512×512 SLM (250 Kbit pages), the frame time of the data SLM needs to be 12 ms or proportionally less for smaller page sizes. This is easily accommodated by binary SLMs currently in development based on PLZT, MQW, ferroelectric liquid crystals, or magneto-optics. The access time for readout of the optical cache memory is determined by the address SLM.

Unlike the data SLM 1006, the address SLM 1004 frame time is not limited by the I/O bandwidth because of the small number of address codes that need to be displayed. For example, if 2000 pages are recorded in the hologram for a total cache size of 500 Mbits, then only 2000 different address patterns need to be displayed. Logic (not shown) to generate the patterns can be included in the structure of the address SLM 1004 itself so that only 11 bits need to be loaded to select which address to display.

The address SLM 1004 frame time and therefore the access time of the optical cache memory is therefore limited only by the optical response time. For PLZT or MQW material, this can be less than 10 ns. The optical cache memory 100 requires 2-D address codes in order to address large number of pages with low crosstalk using SLM addressing. This removes the need for complicated beam deflection devices consisting of multiple acousto-optic cells or cumbersome wavelength-tuning lasers which are difficult to control.

The number of orthogonal phase codes that can be generated by an SLM is equal to the number of pixels. Therefore, for the same spatial density of pixels, a two-dimension SLM can generate many more address codes than a one-dimensional SLM.

However, conventional volume holographic techniques do not permit use of arbitrary 2-D codes due to crosstalk effects, as will be shown in the next section. The present invention includes a new holographic recording method, cascaded-grating holography, which allows arbitrary 2-D address codes and makes construction of optical cache memory commercially feasible.

The simplest 2-D SLM for addressing the hologram is a combination of two crossed 1-D SLMs. The pages read out optically from the hologram are converted into electronic form with a 2-D multi-port detector, such as a charge injection device (CID) camera. The advantages of a multiport CID camera (which has been demonstrated by CID-Technologies, Inc.) are nondestructive random reads and parallel readout of blocks within pages. A 4-port camera with 40 MHz bandwidth on each of the 4 output lines for a total bandwidth of 160 MHz has recently been demonstrated by CID Technologies. By extending this technology to 10 ports, a total I/O bandwidth of 400 Mbits/sec from the optical cache memory can be achieved.

Other commercial detectors that could be adapted to this application are also available. For example, Kodak now sells a standard 128×128 CCD detector with 64 parallel output lines. This detector achieves a parallel output data rate of 700 Mbits/s.

The angular or Bragg selectivity of a volume photorefractive grating can be very high. Since a hologram consists of a collection of such gratings, the resultant storage capacity can be very high. For example, 5000 high quality images consisting of 70,000 pixels each have been stored in a single photorefractive crystal. The Bragg condition states that a beam will be reconstructed only if the angle of incidence of the incident beam relative to the grating is approximately equal to that of the original writing beam. The angular selectivity for reconstruction can be calculated from coupled-mode theory and is very high. The selectivity is greater for thicker crystals.

Figure 3:
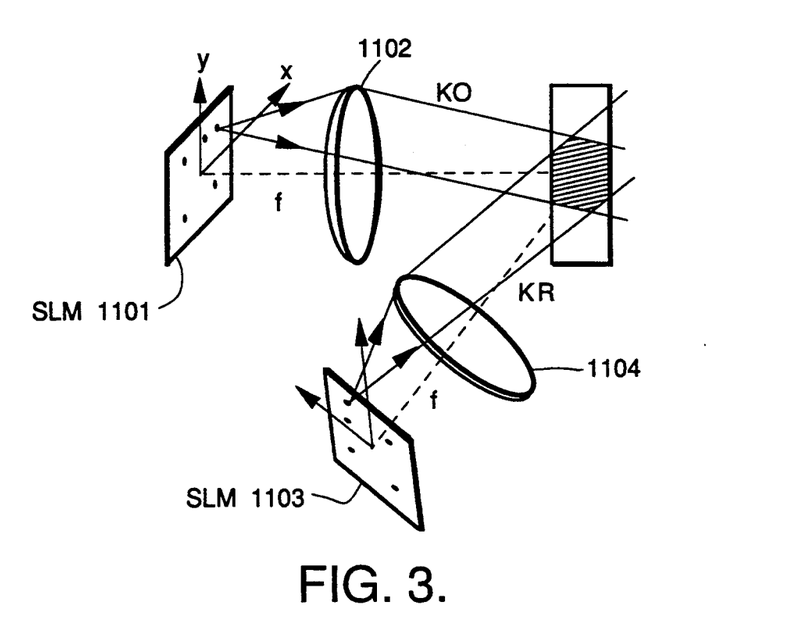
FIG. 3 is a representation of the geometry for recording a hologram.

The Bragg condition is best analyzed by representing each individual plane wave component of the light beam by a k-vector. (The direction of the k-vector corresponds to the direction of propagation and the magnitude of the k-vector is the inverse of the wavelength.) The Bragg condition can then be described geometrically as a vector sum:

$$K_R + K_G = K_O,$$

where $K_R$ and $K_O$ are the wavevectors of the incident and diffracted beams, respectively, and $K_G$ is the grating wavevector. As shown in FIG. 3, by placing SLMs 1101 and 1103 in the front focal planes of lenses 1102 and 1104, the $K_R$ and $K_O$ beams can be generated by individual SLM pixels.

The grating wavevector $K_G$ has an uncertainty volume associated with it due to the finite physical size of the hologram and the nonzero size of the SLM pixels. Dividing the accessible volume of k-space by the volume of the uncertainty volume results in the maximum theoretical storage capacity of the photorefractive crystal. It can be shown that the storage capacity is limited by two upper bounds due to the hologram and pixel dimensions. For an active crystal volume of a few cubic millimeters and reasonable optical parameters, the values of the two theoretical upper bounds range from $10^{10}$ to $10^{12}$ bits.

The high theoretical storage capacity and parallel access to data is a direct result of the three-dimensional nature of optical holographic storage. However, other nonfundamental factors also limit the practical performance. The challenge is to construct holographic storage systems that reduce the difference between actual performance and theoretical limits by attacking these factors. A variety of mechanisms limit the practical holographic storage capacity of photorefractive crystals to values below the theoretical limit. They include hologram dynamic range and resolution, Bragg degeneracy, beam coupling, and laser, hologram, and detector noise. In the context of this application, the problems associated with Bragg degeneracy and beam coupling—factors which can be alleviated using cascaded-grating holography—are addressed.

One of the most important impediments to holographic neural networks is crosstalk which arises from an effect known as "Bragg degeneracy." The Bragg condition states that the angle of incidence of a light relative to a volume grating must match one of the original writing beams in order to form an optical connection. However, even if the angular selectivity is high, crosstalk can still occur. Given a particular grating, it is possible for many light beams to satisfy the Bragg condition for that grating, in addition to the beams which originally wrote the grating.

Figure 4:
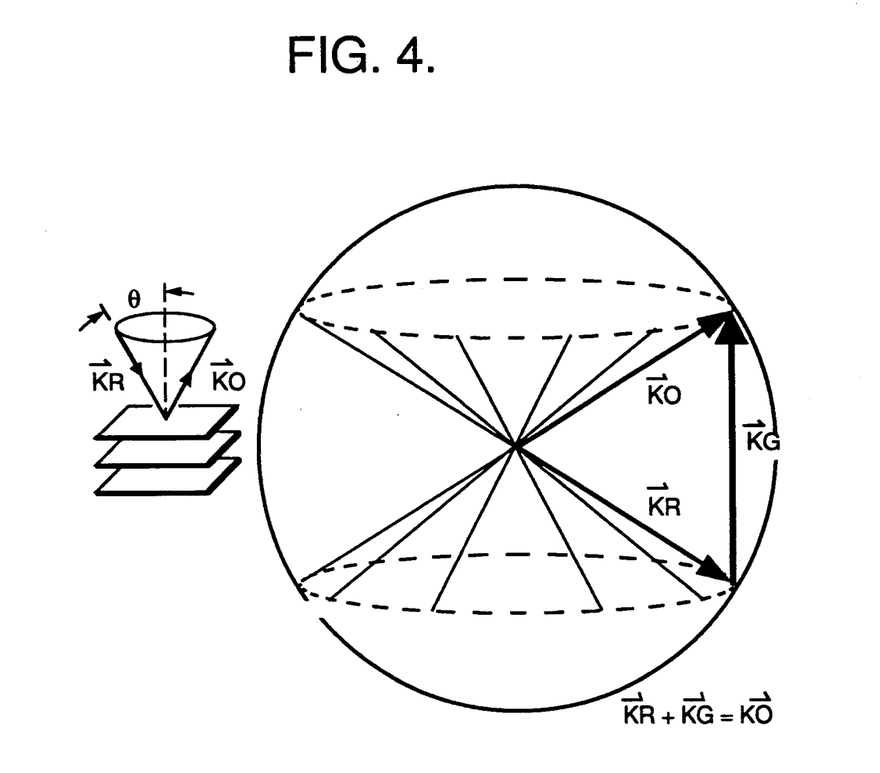
FIG. 4 is a diagrammatic representation of crosstalk due to Bragg degeneracy.

Referring now to FIG. 4 what is shown is a k-space diagram that shows the beam pairs associated with cross talk. As shown in this Figure, a set of beam pairs ($K_O$ and $K_R$) which define the surfaces of two end-to-end cones all form the same angle with respect to grating. These pair of beams cannot be utilized due to crosstalk. All the pixel pairs defined by the cones are connected by that grating even though it was written by only one grating pair. Therefore, a large set of beams other than the original writing beam can scatter constructively from the grating, forming erroneous reconstructions and crosstalk.

Figure 5:
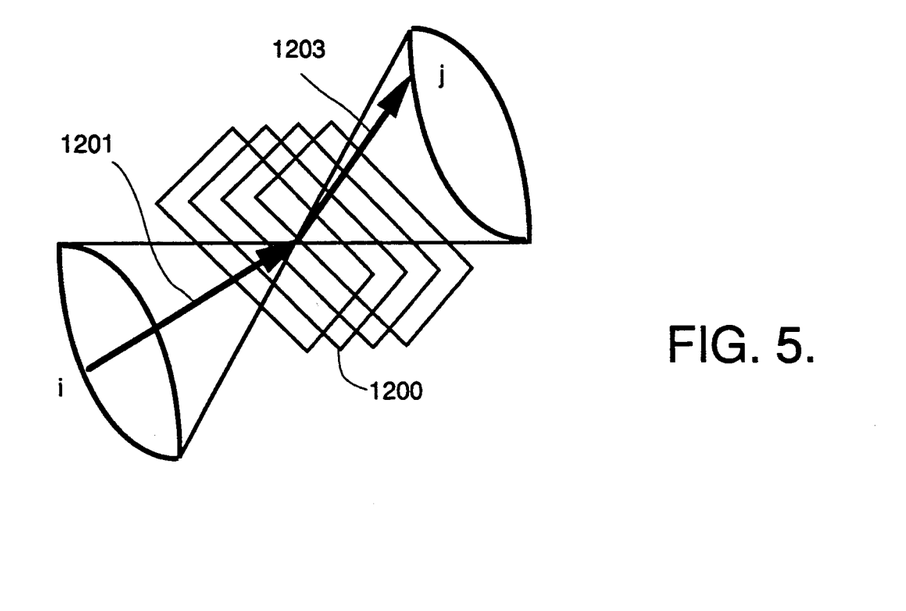
FIG. 5 is a representation of a single grating holographic recording.
Figure 6:
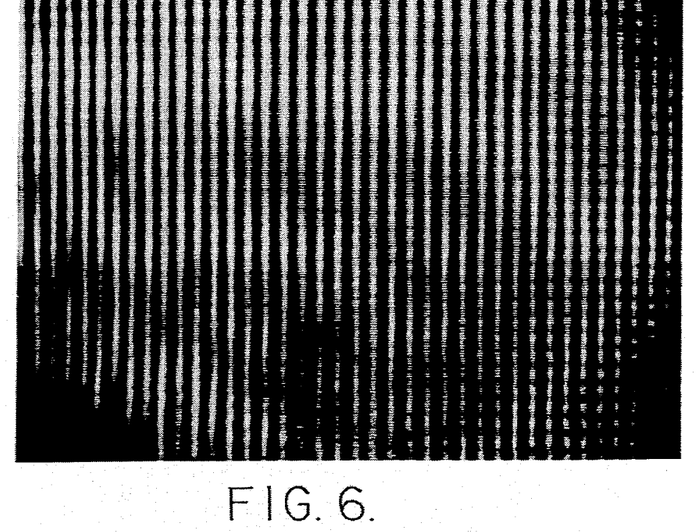
FIG. 6 is a representation of Bragg degeneracy in a hologram.

FIG. 5 is a diagram of the single grating weighting connection between two beams. In this prior art system, the connection between i beam 1201 and j beam 1203 is the single grating 1200. As has been before mentioned this system suffers from Bragg degeneracy. An experimental demonstration of Bragg degeneracy is shown in FIG. 6. A hologram is recorded in a c-cut $BaTiO_3$ crystal using a laser diode light source with a wavelength of 830 nm. (The wavelength and crystal geometry were chose for low two-wave mixing gain order to eliminate beam fanning which, as will be shown later in this application, can be used to eliminate Bragg degeneracy.) The experimental configuration of FIG. 3 was used. During recording the object plan consisted of a regular rectangular grid pattern, and the reference plane was a uniformly filled block (all pixels on).

When the hologram was read out using the uniform reference, the reconstructed object was smeared in the vertical direction. No horizontal smearing can be observed. This can be easily explained using geometric arguments. The grating k-vector created by one pair of beams $K_R$ and $K_O$ also connects all beams above and below $K_R$ in the reference plane. These beams reconstruct extraneous beams which appear above and below the original beam $K_O$. This results in vertical smearing. Horizontally displaced beams are not connected by the same grating k-vector; therefore, horizontal smearing is much less. Note that Bragg degeneracy cannot be eliminated by simply phase aberrating the reference beam, since the above construction would still hold for the individual plane wave components.

A second major source of distortion in holograms is energy transfer between Bragg-matched beams via two-wave mixing. This occurs because when an input beam is Bragg-matched to a grating, the reconstructed beam is also Bragg-matched. This beam can then itself read out the same grating and reconstruct the input beam. If the gain-length product of the grating is sufficiently high, energy transfer or beam coupling can occur between the two beams. The effects of beam coupling on holographic image quality have been analyzed using various methods. It has been found that distortion increases rapidly as the diffraction efficiency increases.

The essence of the cascaded-grating concept is to use a set of angularly and spatially multiplexed gratings to store each connection between pixels rather than a single grating. Forcing a light beam to match the Bragg condition at each of a cascaded series of spatially and angularly distributed gratings greatly reduces the two major sources of crosstalk described above.

Figure 7:
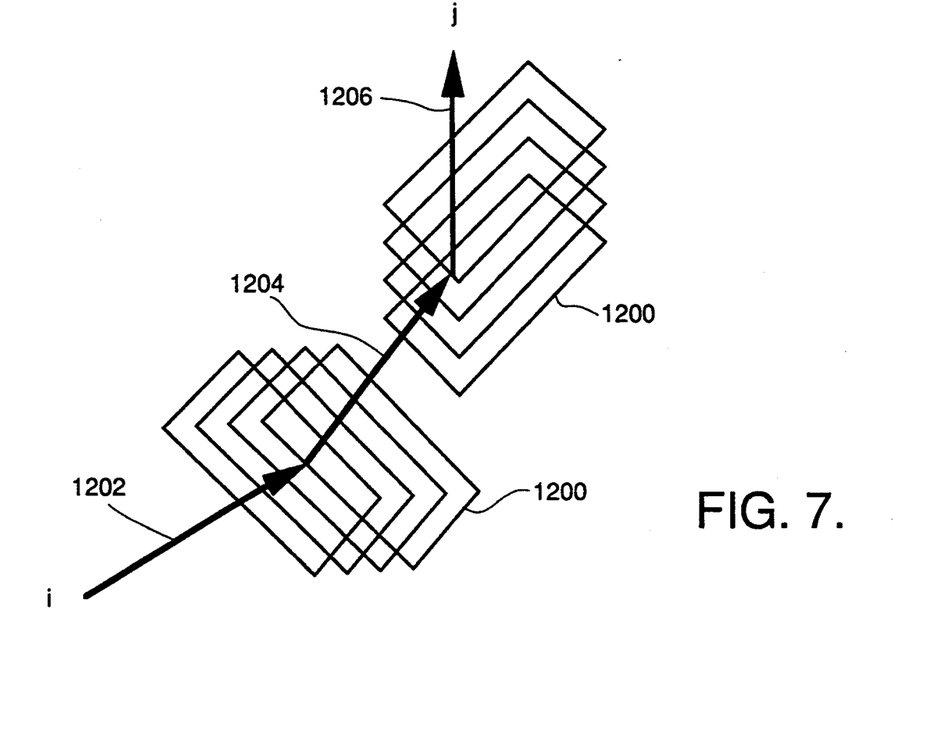
FIG. 7 is a representation of a cascaded-grating holographic recording in accordance with the present invention.

Referring now to FIG. 7 what is shown is a cascaded grating connection between an i beam 1202 and a j beam 1206. In this embodiment an intermediate beam 1204 is provided between the i beam 1202 and the j beam 1206 via gratings 1200.

Two gratings 1200 in series will connect only a single input-output pair of beams 1202 and 1206 via an intermediary diffracted beam 1204. All other beam triplets (input, intermediary, and output beams) will not be able to match the Bragg conditions at both gratings because the intermediary diffracted beam will not lie on the Bragg degeneracy cone of the second grating. An undesired beam on the Bragg degeneracy cone of one grating is therefore rejected by the remaining gratings. This allows the pixels to be arranged in arbitrary patterns on the SLM, increasing the storage capacity (since all pixels can be used) and throughput.

A nonlinear optical effect known as "beam fanning" is utilized to generate the cascaded gratings. Beam fanning is a well-known effect in high gain photorefractive crystals in which an input beam is initially scattered by small inhomogeneities in the crystal, resulting in low amplitude scattered optical noise. The noise beams then interfere with the original input beam and write gratings. Scattering of the input beam by these gratings selectively amplifies some of the noise beams by the process of energy transfer via two-wave mixing.

The amplified beams then write new gratings and the process cascades. Which beams are amplified most is determined by the electro-optic tensor of the crystal and the orientation of the input beam. The net effect is that the input beam literally fans in the crystal as it writes a set of spatially and angularly distributed gratings.

Figure 8:
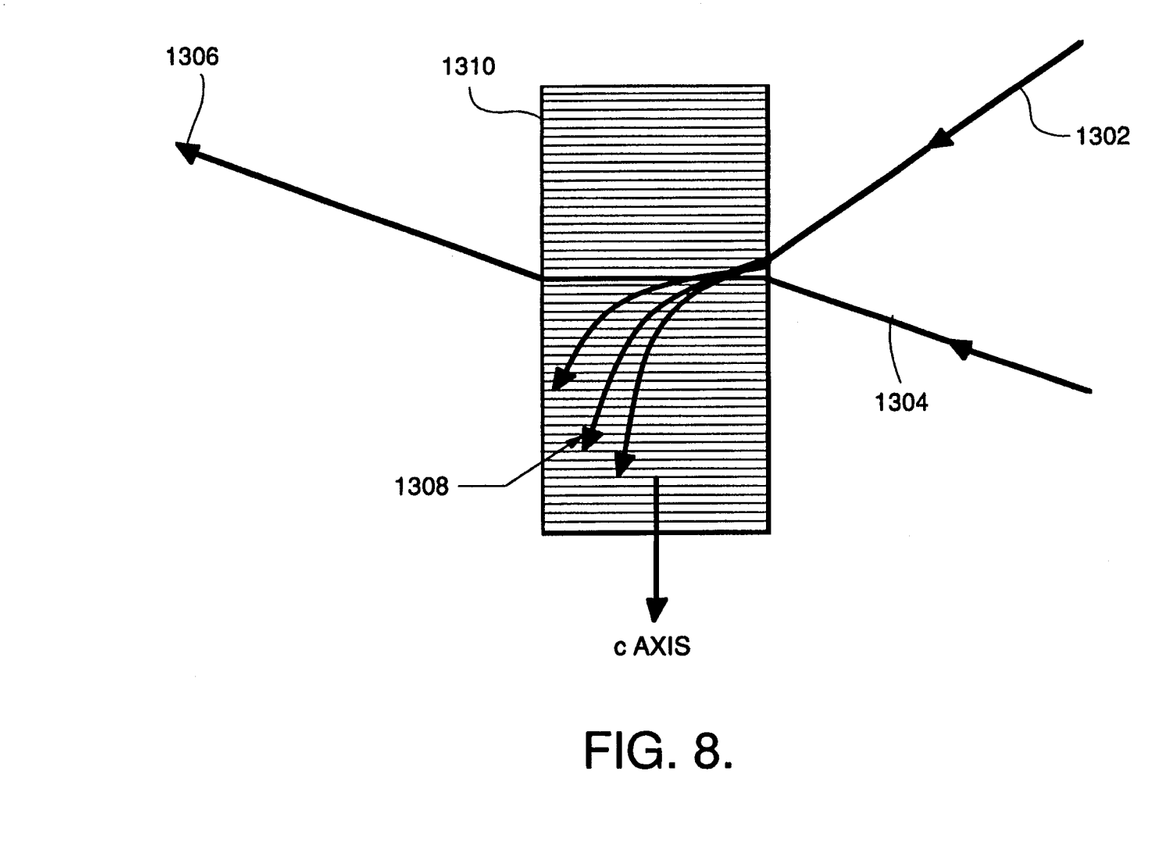
FIG. 8 is a representation of beam fanning in photorefractive crystal.

FIG. 8 shows a reference beam 1302 and an object beam 1304 being provided to a photorefractive crystal 1310. In a preferred embodiment, the crystal 1310 comprises barium titanate ($BaTiO_3$).

As illustrated in the Figure, this fanned light can be used as a reference beam 1302. When it is interfered with by a second, unfanned object beam 1304 the combination forms a holographic recording via output 1306 that suffers neither from Bragg degeneracy (because multiple cascaded gratings store each connection) nor from distortions due to beam coupling (because each individual signal grating has a low gain-length product). An unfanned object beam 1304 is used because object beam fanning would degrade the quality of the reconstructed object image. Fanning can be controlled, by adjusting the orientation of the beams relative to the crystal so that the reference beam fans and the object beam does not.

The fanning process generates high gain-length "fanning gratings" which divide each reference beam into a set of beams at different orientations and locations. During the recording, the object beams form a set of "signal gratings" in which the connection weights are stored. Both the signal and fanning gratings are angularly and spatially multiplexed. Upon readout each reference beam must match the Bragg condition at a multitude of fanning gratings, which breaks the Bragg degeneracy.

In addition, the beamlets reconstructed by the signal gratings are all in phase and sum coherently; hence the aggregate diffraction efficiency can be high even though the diffraction efficiency of any individual signal grating is small. The low gain-length product of the individual signal gratings also greatly reduces distortions due to beam coupling. Another advantage of fanning the reference beam is that the region for interaction between the object and reference beams is greatly increased; hence, more of the crystal is utilized and the dynamic range is increased.

Figure 9:
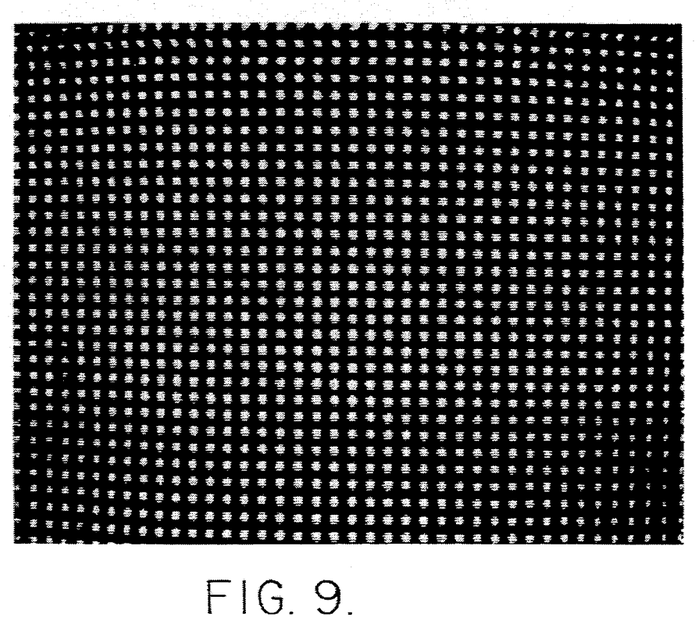
FIG. 9 is a representation of a hologram that does not have Bragg degeneracy.

Referring now to FIG. 9 what is shown is a holographic recording provided by a system in accordance with the present invention in which $BaTiO_3$ is utilized as the photorefractive crystal. As is seen from this recording, there is no Bragg degeneracy, hologram crosstalk, or distortions due to beam coupling.

Due to the spatially-multiplexed nature of the fanning gratings and the associated spreading filamentation of the reference beam it has been found experimentally that there is increased efficiency in this architecture for superimposed holograms. Light from a particular reference pixel is directed by the fanning gratings to the signal gratings, which connect it with object pixels. Reference and signal gratings which are not associated with that reference pixel tend to be bypassed; therefore, each grating tends to be erased only by light beams which are connected by that grating. The gratings are therefore erased less by subsequent exposures than one would expect for complete overlap of the beams. This improved efficiency performance for superimposed holograms is another desirable feature of cascaded-grating holography.

Although we discuss optical memory in the context of a disk cache, it would also find applications in future optical computers as temporary storage for multiple 2-D planes of optical data. Such applications would take advantage of the parallel access capabilities of optical cache memory.

Cascaded-grating holography eliminates crosstalk from Bragg degeneracy, allowing 2-D reference patterns with much larger number of associated orthogonal address codes. In other words, cascaded-grating holography permits many more addresses to be generated.

Hence, an optical cache memory is provided that has increased memory capacity and overcomes a significant problem associated with holographic memory storage—Bragg degeneracy. Through the cascaded-grating technique this problem is significantly reduced and consequently a practical optical cache memory is commercially possible. This type of memory will have significant advantages over current DRAM technology. The optical cache memory of the present invention simultaneously achieves short access time, high I/O bandwidth and high density, something not presently possible in state of the art DRAM technology.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined by the appended claims.

I claim:

1. An optical cache memory architecture for use with a computer comprising:
    a cache controller for receiving and controlling address information from the computer;
    means for receiving data information from the computer;
    means for receiving address information from the cache controller;
    holographic means for recording the address information and data information with beam fanning as a cascaded series of spatially and angularly distributed gratings to allow for multiple 1-D and 2-D phase codes; and
    means for converting the recorded holographic data and address information into digital data information.

2. The optical cache memory of claim 1 in which the data information receiving means comprises:
    a first spatial light modulator (SLM).

3. An optical cache memory architecture for use with a computer comprising:
    a cache controller for receiving and controlling address information from the computer;
    means for receiving data information from the computer;
    means for receiving address information from the cache controller;
    holographic means for recording the address information and data information, the holographic means including beam fanning to allow for multiple 1-D and 2-D phase codes; and
    means for converting the recorded holographic data and address information into digital data information, in which the data information receiving means comprises a first spatial light modulator (SLM) and in which the address information receiving memory comprises a second spatial light modulator (SLM).

4. The optical cache memory architecture of claim 3 in which the first SLM is two dimensional and formats serial line streams into pages.

5. The optical cache memory architecture of claim 3 in which the second SLM which retrieves memory pages using two dimensional orthogonal phase codes.

6. An optical cache memory architecture for use with a computer comprising:
    a cache controller for receiving and controlling address information from the computer;
    means for receiving data information from the computer;
    means for receiving address information from the cache controller;

holographic means for recording the address information and data information, the holographic means including beam fanning to allow for multiple 1-D and 2-D phase codes; and means for converting the recorded holographic data and address information into digital data information, in which the holographic means comprises a photorefractive crystal with a high gain such that there is significant beam fanning to implement angular and spatial multiplexing of holograms simultaneously.

7. The optical cache memory architecture of claim 6 in which the photorefractive crystal comprises barium titanate.

8. A method for utilizing an optical cache memory architecture within a computer, the method comprising the steps of:

(a) receiving data information from a CPU within the computer;

(b) receiving address information from a cache controller within the memory architecture;

(c) recording the address information and data information as a cascaded series of spatially and angularly distributed gratings using beam fanning to provide holographic data and address information with multiple 1-D and 2-D phase codes; and (d) converting the recorded holographic data and address information into digital data information.

9. The method of claim 8 in which step (a) further includes formatting two dimensional serial line streams into pages.

10. The method of claim 8 in which step (b) further includes retrieving memory pages using two dimensional orthogonal phase codes.

11. An optical cache memory architecture for use with a computer comprising:

a cache controller for receiving and controlling address information from the computer;

a first spatial light modulator (SLM) for receiving data information from the computer, the first SLM being two dimensional and formatting serial line streams into pages;

a second SLM for receiving address information from the cache controller, the second SLM for retrieving memory pages using two dimensional phase codes;

a photorefractive crystal for recording the address information and data information, the crystal including beam fanning therewithin to allow for multiple 1-D and 2-D phase codes; and a charge injection detector (CID) for converting the recorded holographic data and address information into digital data information.

12. The optical cache memory architecture of claim 11 in which the photorefractive crystal has a high gain such that there is significant beam fanning to implement angular and spatial multiplexing of holograms simultaneously.

13. The optical cache memory architecture of claim 12 in which the photorefractive crystal comprises barium titanate.

* * * * *